United States Patent
Lin et al.

(10) Patent No.: US 10,453,947 B1
(45) Date of Patent: Oct. 22, 2019

(54) SEMICONDUCTOR STRUCTURE AND HIGH ELECTRON MOBILITY TRANSISTOR WITH A SUBSTRATE HAVING A PIT, AND METHODS FOR FABRICATING SEMICONDUCTOR STRUCTURE

(71) Applicant: Vanguard International Semiconductor Corporation, Hsinchu (TW)

(72) Inventors: Yung-Fung Lin, Taoyuan (TW); Cheng-Wei Chou, Taoyuan (TW); Szu-Yao Chang, New Taipei (TW); Cheng-Tao Chou, Yunlin County (TW); Hsiu-Ming Chen, Taoyuan (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/005,964

(22) Filed: Jun. 12, 2018

(51) Int. Cl.
*H01L 29/778* (2006.01)
*H01L 29/20* (2006.01)
*H01L 21/324* (2006.01)
*H01L 29/06* (2006.01)
*H01L 21/304* (2006.01)
*H01L 29/66* (2006.01)

(52) U.S. Cl.
CPC ......... *H01L 29/778* (2013.01); *H01L 21/304* (2013.01); *H01L 21/324* (2013.01); *H01L 29/0649* (2013.01); *H01L 29/2003* (2013.01); *H01L 29/66462* (2013.01)

(58) Field of Classification Search
None
See application file for complete search history.

(56) References Cited

U.S. PATENT DOCUMENTS

| 6,548,333 | B2 | 4/2003 | Smith | |
| 10,164,048 | B1* | 12/2018 | More | H01L 29/665 |
| 2004/0232436 | A1* | 11/2004 | Tasi | H01L 33/025 |
| | | | | 257/103 |
| 2006/0118802 | A1* | 6/2006 | Lee | H01L 33/12 |
| | | | | 257/98 |
| 2007/0259504 | A1* | 11/2007 | Bour | C30B 25/02 |
| | | | | 438/341 |
| 2010/0019277 | A1* | 1/2010 | Hata | H01L 29/207 |
| | | | | 257/190 |
| 2010/0133548 | A1* | 6/2010 | Arena | H01L 21/02458 |
| | | | | 257/76 |

(Continued)

OTHER PUBLICATIONS

Bondokov, Robert T., et al. "Large-Area AlN Substrates for Electronic Applications: An Industrial Perspective." Journal of Crystal Growth, vol. 310, No. 17, 2008, pp. 4020-4026., doi:10.1016/j.jcrysgro.2008.06.032. (Year: 2008).*

(Continued)

*Primary Examiner* — J. E. Schoenholtz
(74) *Attorney, Agent, or Firm* — Birch, Stewart, Kolasch & Birch, LLP

(57) ABSTRACT

A semiconductor device includes a substrate, a flowable dielectric material and a GaN-based semiconductor layer. The substrate has a pit exposed from an upper surface of the substrate, the flowable dielectric material fully fills the pit, and the GaN-based semiconductor layer is disposed over the substrate and the flowable dielectric material.

17 Claims, 6 Drawing Sheets

(56) References Cited

U.S. PATENT DOCUMENTS

| | | | |
|---|---|---|---|
| 2010/0244197 A1* | 9/2010 | Arena | H01L 21/0242 257/615 |
| 2011/0221039 A1* | 9/2011 | Singh | C30B 25/186 257/615 |
| 2011/0233519 A1* | 9/2011 | Cheng | H01L 21/0237 257/15 |
| 2012/0076968 A1* | 3/2012 | Dmitriev | C30B 25/02 428/64.1 |
| 2014/0162431 A1* | 6/2014 | Lin | H01L 21/02164 438/435 |
| 2015/0014824 A1* | 1/2015 | Kononchuk | H01L 21/02664 257/647 |
| 2016/0377972 A1 | 12/2016 | Hofmann et al. | |

OTHER PUBLICATIONS

Hashimoto, S & Akita, Katsushi & Tanabe, T & Nakahata, H & Takeda, K & Amano, H. (2010). Epitaxial layers of AlGaN channel HEMTs on AlN substrates. SEI Technical Review. 83-87. (Year: 2010).*

Qi, Meng, et al. "Strained GaN Quantum-Well FETs on Single Crystal Bulk AlN Substrates." Applied Physics Letters, vol. 110, No. 6, 2017, p. 063501., doi:10.1063/1.4975702. (Year: 2017).*

* cited by examiner

SEMICONDUCTOR STRUCTURE AND HIGH ELECTRON MOBILITY TRANSISTOR WITH A SUBSTRATE HAVING A PIT, AND METHODS FOR FABRICATING SEMICONDUCTOR STRUCTURE

BACKGROUND

Technical Field

The disclosure relates to semiconductor fabricating technology, and more particularly, to semiconductor structures having a GaN-based semiconductor material and methods for fabricating the same.

Description of the Related Art

Gallium nitride-based (GaN-based) semiconductor materials have many excellent characteristics, such as high thermal resistance, wide band-gap, and a high electron saturation rate. Therefore, GaN-based semiconductor materials are suitable for use in high-speed and high-temperature operating environments. In recent years, GaN-based semiconductor materials have been widely used in light-emitting diode (LED) elements and high-frequency elements, such as high electron mobility transistors (HEMT) with heterogeneous interfacial structures.

With the development of GaN-based semiconductor materials, semiconductor structures which use GaN-based semiconductor materials are applied in the more critical working environments, such as those with higher frequencies or higher temperatures. Therefore, the process conditions of fabricating semiconductor devices with GaN-based semiconductor materials face various new challenges.

SUMMARY

Some embodiments of the present disclosure provide a semiconductor structure. The semiconductor structure includes a substrate having a pit exposed from an upper surface of the substrate, a flowable dielectric material which fully fills the pit, and a GaN-based semiconductor layer disposed over the substrate and the flowable dielectric material.

Some embodiments of the present disclosure provide a HEMT. The HEMT includes an AlN substrate having pits exposed from an upper surface of the AlN substrate, a borophosphosilicate glass which fully fills the pits, a GaN semiconductor layer disposed over the AlN substrate and the BPSG, an AlGaN semiconductor layer disposed over the GaN semiconductor layer, and a source electrode, a drain electrode and a gate electrode disposed over the AlGaN semiconductor layer.

Some embodiments of the present disclosure provide a method for fabricating a semiconductor structure. The method includes providing a substrate having a pit exposed from an upper surface of the substrate, forming a flowable dielectric material on the substrate, performing a heat treatment so that the flowable dielectric material reflows into and fully fills the pit, performing a planarization process to remove a portion of the flowable dielectric material outside of the pit and expose the upper surface of the substrate, and forming a GaN-based semiconductor layer over the substrate after the planarization process.

The semiconductor structures of the present disclosure can be applied to various types of semiconductor devices. In order to make features and advantages of the present disclosure easy to understand, a detailed description is given in the following embodiments with reference to the accompanying drawings.

BRIEF DESCRIPTION OF THE DRAWINGS

The embodiments of the disclosure can be more fully understood by reading the subsequent detailed description and examples with references made to the accompanying drawings. For clarity of illustration, various elements in the drawings may not be drawn to scale, wherein.

DETAILED DESCRIPTION

Figure 1A:
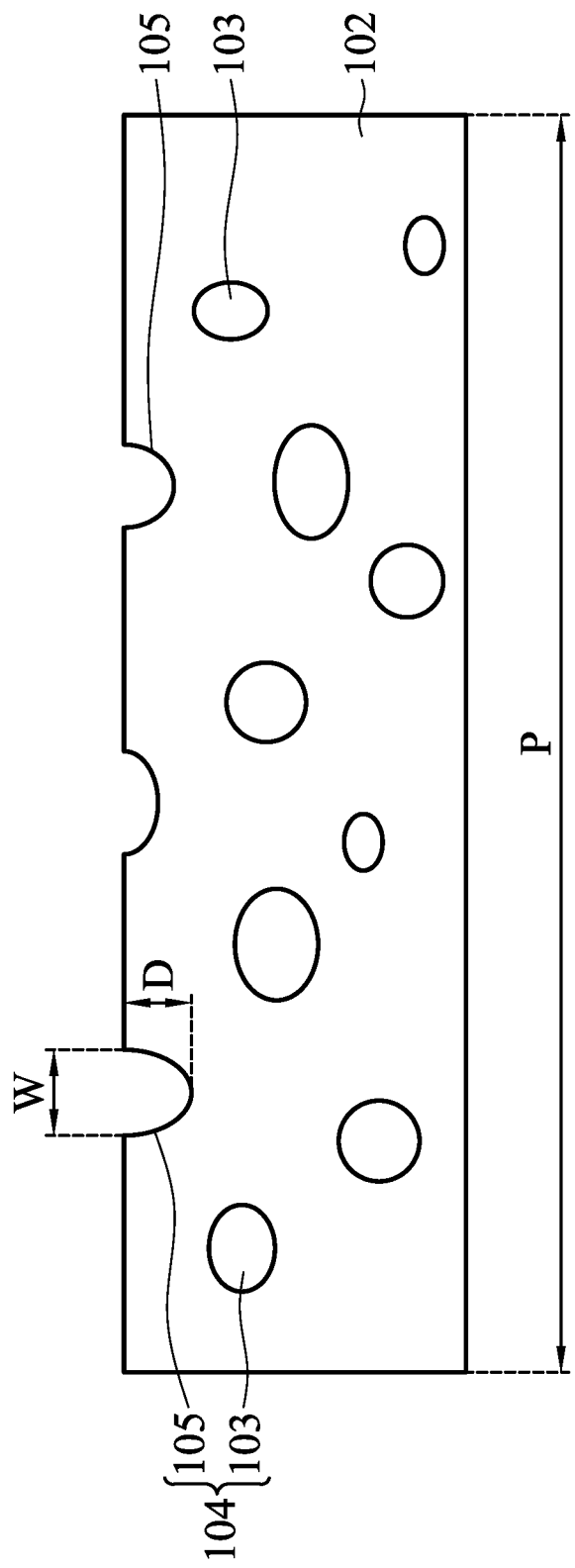
FIGS. 1A-1E illustrate cross-sectional views of forming a substrate structure at various intermediate stages in accordance with some embodiments of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first component over or on a second component in the description that follows may include embodiments in which the first and second components are formed in direct contact, and may also include embodiments in which additional components may be formed between the first and second components, such that the first and second components may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of some embodiments are discussed below. Throughout the various views and illustrative embodiments, like reference numbers are used to designate like elements. It should be understood that additional operations can be provided before, during, and after the method, and some of the operations described can be replaced or eliminated for other embodiments of the method.

The present disclosure provides semiconductor structures and HEMTs and methods for fabricating the same. Generally, a semiconductor device including a GaN-based semiconductor material is formed over a ceramic substrate. Since the ceramic substrate which is formed by powder metallurgy has pits formed at the surface of the substrate, when the ceramic substrate is used for semiconductor processes, material layers formed on the substrate are also formed in the pits, which reduces the manufacturing yield of the semiconductor device. In order to improve the manufacturing yield of the semiconductor device, the present disclosure provides a method for fabricating a semiconductor structure. The method includes forming a flowable dielectric material on a substrate having pits exposed from the upper surface of the substrate, reflowing and filling the flowable dielectric material into the pits by a heat treatment, and then performing a planarization process on the flowable dielectric material to expose the upper surface of the substrate, so that the substrate can provide a planar surface for subsequent semiconductor processes.

Figure 1B:
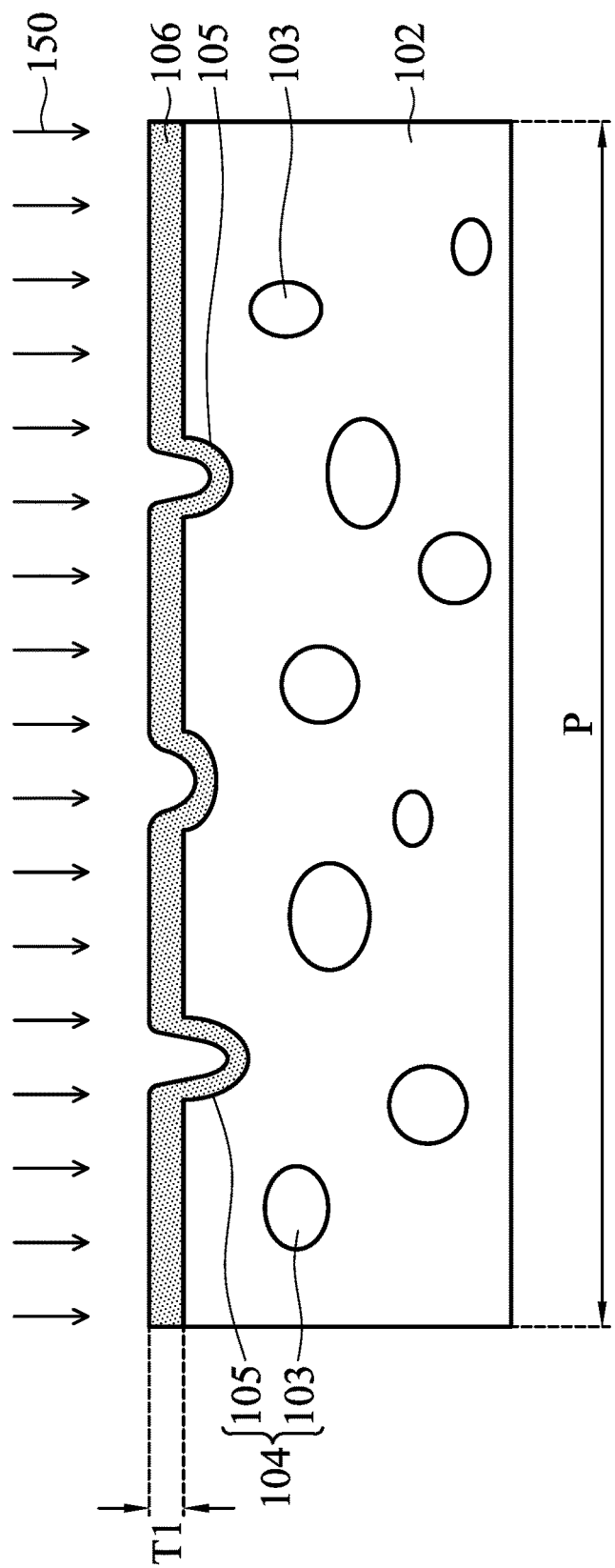
Figure 1C:
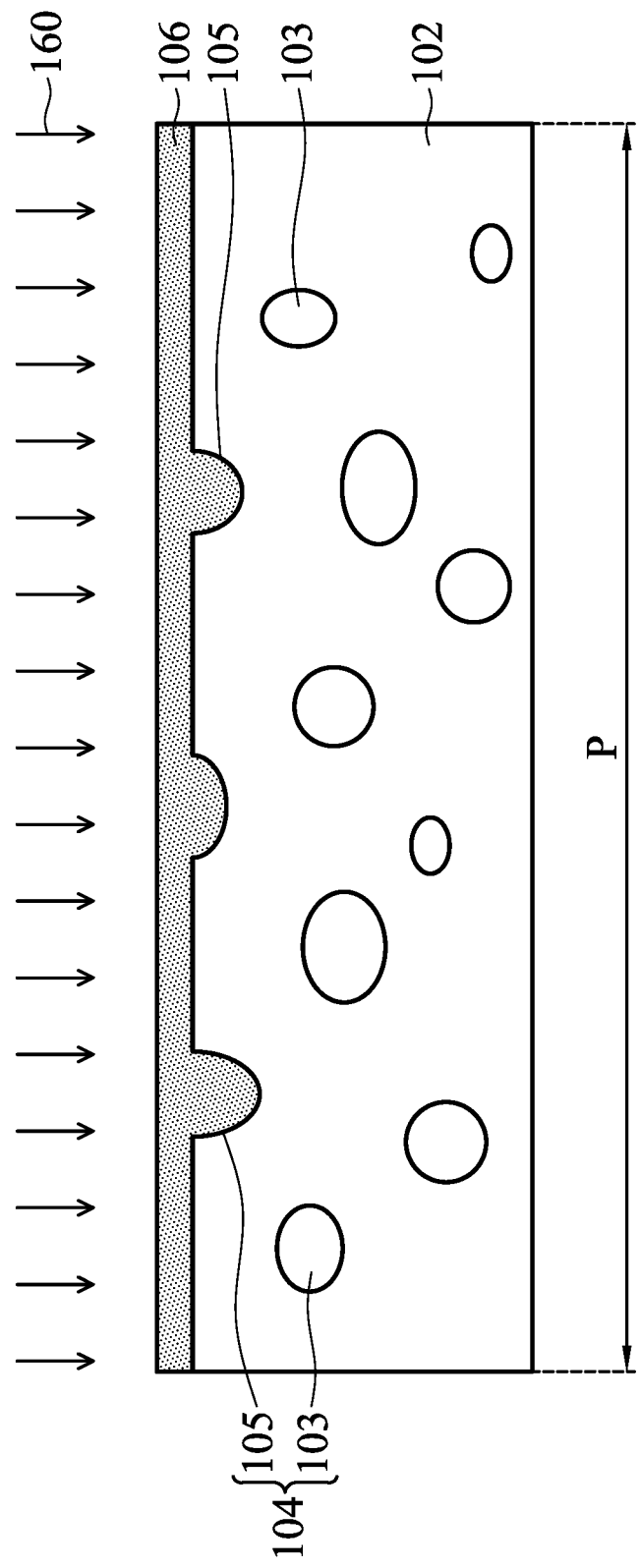
Figure 1D:
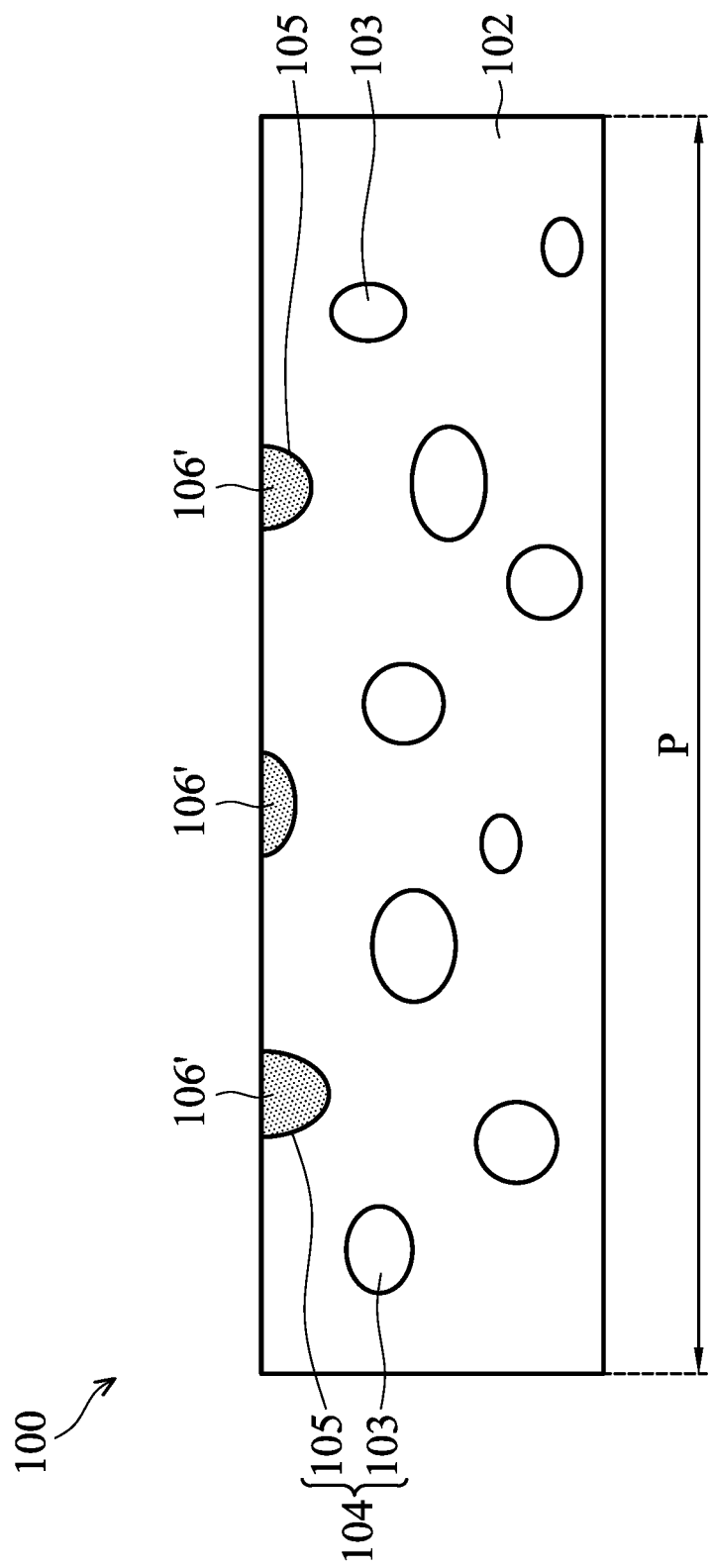
Figure 1E:
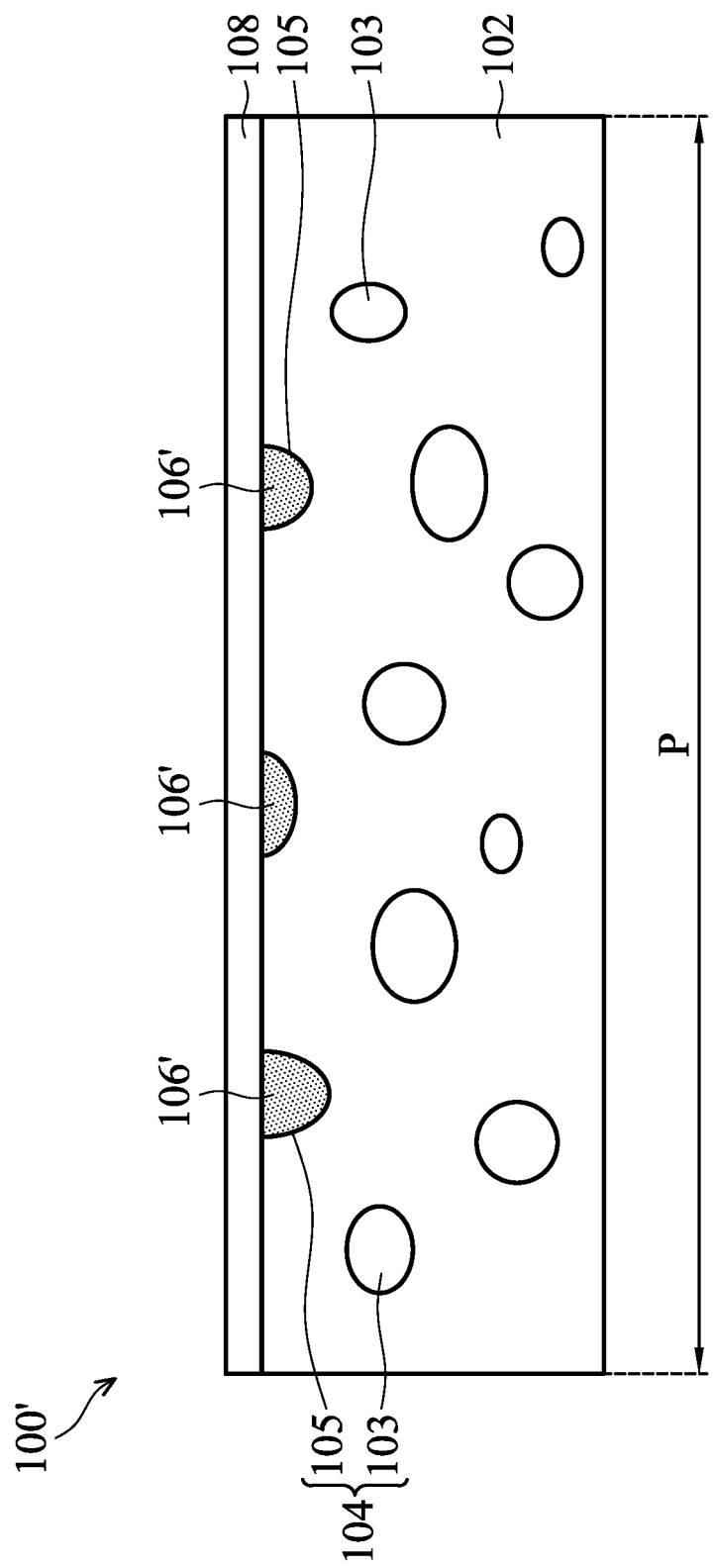

FIGS. 1A-1E illustrate cross-sectional views of forming a substrate structure 100' shown in FIG. 1E at various intermediate stages in accordance with some embodiments of the present disclosure. Referring to FIG. 1A, a substrate 102 is provided. The substrate 102 may be circular, and the substrate 102 has a diameter P which may be 4 inches or more, such as 6 inches, 8 inches or 12 inches, making it suitable for use in manufacturing equipment used in the semiconductor industry.

The substrate 102 intrinsically has some defects 104 which include holes 103 within the substrate 102 and pits 105 exposed from the upper surface of the substrate 102. In some embodiments, the substrate 102 is a ceramic substrate formed by powder metallurgy in which ceramic powders are sintered at a high temperature. For example, the substrate 102 is an aluminum nitride (AlN) substrate, a silicon carbide (SiC) substrate, a sapphire substrate or the like. During sintering the ceramic powders to form the substrate 102, gaps between the ceramic powders gradually shrink and disappear. After the sintering, the gaps between the ceramic powders do not completely disappear. Thus, some defects 104 may still be present in the interior of the substrate 102 and on its surface. In addition, even the substrate 102 after sintered is polished and ground, new pits 105 are created from the upper surface of the substrate 102.

In some embodiments, the substrate 102 is used to fabricate a semiconductor device including a GaN-based semiconductor layer, such as a light-emitting diode (LED), a high frequency or high voltage device. For example, the high frequency or high voltage device may be a high electron mobility transistor (HEMT), a Schottky bipolar diode (SBD), a bipolar junction transistor (BJT), a junction field effect transistor (JFET), or an insulated gate bipolar transistor (IGBT).

Since the pits 105 are present at the upper surface of the substrate 102, materials subsequently formed on the substrate 102 are also formed in the pits 105. As scaling down the size of the semiconductor elements, the pits 105 at the upper surface of the substrate 105 become the killer defects for semiconductor devices, which reduces the manufacturing yield of semiconductor devices. Thus, there is need to solve the problem of low manufacturing yield caused by pits at the upper surface of the substrate.

It should be noted that although the pits 105 as shown in FIG. 1A has curved cross-sectional profiles, the shapes of the pits 105 are not limited thereto. Actually, the pits 105 may have irregular cross-sectional profiles. In the cross-sectional view of FIG. 1A, the pits 105 may have respective width W as measured along a lateral direction and respective depth D as measured along a longitudinal direction. In some embodiments of the present disclosure, when a pit 105 has a depth D greater than its width W, the size of the pit 105 may be defined by its depth D. Conversely, when a pit 105 has a width W greater than its depth W, the size of the pit 105 may be defined by its width W. Generally, the size of the pits 105 may be in a range from about 0.5 μm to about 15 μm.

Referring to FIG. 1B, a flowable dielectric material 106 is formed on the upper surface of the substrate 102. The flowable dielectric material 106 fills the pits 105 and conforms to the profile of the pits 105. The flowable dielectric material 106 has a thickness T1 on the upper surface of the substrate 102. In some embodiments, since most of the pits 105 have the size greater than the thickness T1 of the flowable dielectric material 106, most of the pits 105 are not fully filled by the flowable dielectric material 106. Although not shown in figures, some pits 105 with smaller size are fully filled by the flowable dielectric material 106.

In the embodiments of the present disclosure, the flowable dielectric material 106 formed on the substrate 102 may be solid-state at a room temperature, and may be heated by a heat treatment to give it a liquid-like flowability. In other words, the flowable dielectric material 106 is a dielectric material that has no flowability at a low temperature but has flowability at a high temperature. In some embodiments, the flowable dielectric material 106 may be spin-on glass (SOG), borophosphosilicate glass (BPSG), phosphosilicate glass (PSG), the like, or a combination thereof. The flowable dielectric material 106 may be formed by spin-on coating, chemical vapor deposition (CVD), the like, or a combination thereof.

Next, after the flowable dielectric material 106 is formed, a heat treatment 150 is performed on the substrate 102 on which the flowable dielectric material 106 is formed, so that the flowable dielectric material 106 may have flowability to reflow. As shown in FIG. 1C, the flowable dielectric material 106 reflows into and fully fills the pits 105. Generally, the dielectric material is deposited to have a thickness at least greater than the size of the pit to fully fill the pit. In the embodiments of the present disclosure, since the flowable dielectric material 106 is used to reflow into the pits 105 by the heat treatment 150, the flowable dielectric material 106 may have the thickness T1 lower than the size of the pits 105. The deposit thickness of the dielectric material and the process time of filling the pits can be significantly reduced, which reduces manufacturing cost.

In an embodiment in which the flowable dielectric material 106 is SOG, the temperature of the heat treatment 150 may be in a range from about 300° C. to about 500° C., such as from about 350° C. to about 450° C. The duration of the heat treatment 150 may be in a range from about 20 minutes to about 60 minutes. When the temperature of the heat treatment 150 is lower than 300° C., SOG may not be reflowed. When the temperature of the heat treatment 150 is higher than 500° C., the flowability of SOG is too high. After the substrate 102 returns to room temperature, cracks may be formed between SOG and the substrate 102, and the substrate 102 may even be broken. In the embodiment in which the flowable dielectric material 106 is SOG, when the flowable dielectric material 106 has the thickness T1 on the upper surface of the substrate 102 greater than about 0.15 of the size of the pit 105, such as in a range from about 0.15 to about 0.3 of that, the reflowed flowable dielectric material 106 can fully fill the pit 105 after the heat treatment 150.

In an embodiment in which the flowable dielectric material 106 is BPSG, the temperature of the heat treatment 150 may be in a range from about 800° C. to about 1000° C., such as from about 850° C. to about 950° C. The duration of the heat treatment 150 may be in a range from about 20 minutes to about 60 minutes. When the temperature of the heat treatment 150 is lower than 800° C., BPSG may not be reflowed. When the temperature of the heat treatment 150 is higher than 1000° C., the flowability of BPSG is too high. After the substrate 102 returns to room temperature, cracks may be formed between BPSG and the substrate 102, and the substrate 102 may even be broken. In the embodiment in which the flowable dielectric material 106 is a BPSG, when the flowable dielectric material 106 has the thickness T1 on the upper surface of the substrate 102 greater than about 0.3 of the size of the pit 105, such as in a range from about 0.3 to about 0.6 of that, the reflowed flowable dielectric material 106 can fully fill the pit 105 after the heat treatment 150.

After the heat treatment 150, a planarization process 160, such as a chemical mechanical polishing (CMP), is performed on the flowable dielectric material 106. As shown in FIG. 1D, after the planarization process 160, a portion of the flowable dielectric material 106 outside of the pits 105 is removed so that the upper surface of the substrate 102 is exposed. The upper surface of the remaining portion 106' of the flowable dielectric material 106 in the pit 105 is substantially coplanar with the upper surface of the substrate 102. In some embodiments, since the polishing selectivity of the substrate 102 is greater than that of the flowable dielectric material 106, the upper surface of the remaining portion 106' of the flowable dielectric material 106 may be slightly lower than the upper surface of the substrate 102.

After the planarization 160, a substrate structure 100 is formed. Compared to the substrate 102, the substrate structure 100 has a substantially planar upper surface to provide semiconductor devices to be formed thereon.

It should be noted that the thermal stability of the flowable dielectric material 106 after the heat treatment 150 is increased. For example, the second reflow temperature for SOD after the heat treatment 150 needs to be greater than about 400° C. to make sure that the SOD is flowable again. For example, the second reflow temperature for BPSG after the heat treatment 150 needs to be greater than about 1100° C. to ensure that the BPSG is flowable again. Thus, when the substrate structure 100 is used in subsequent semiconductor processes, the temperature limit of the subsequent processes depends on the second reflow temperature of the flowable dielectric material 106'. For example, if the pits 105 are filled with BPSG, the temperature limit of the subsequent processes can reach about 1100° C.

Optionally, a capping layer 108 may be globally formed on the upper surface of the substrate 102 and the upper surface of the flowable dielectric material 106' as shown in FIG. 1E to produce the substrate structure 100' in some embodiments.

Compared to the flowable dielectric material 106, the capping layer 108 is a high-quality film with good thermal stability at high temperature. In some embodiments, the capping layer 108 is a high-quality insulating film formed by a thermal growth, such as silicon oxide made from tetraethoxysilane (TEOS). In some other embodiments, the capping layer 108 is a dielectric layer formed by a plasma-enhanced CVD (PECVD), such as silicon oxide, silicon nitride, silicon oxynitride, silicon carbide, the like, or a combination thereof. The capping layer 108 can provide a high-quality surface for forming semiconductor devices thereon. In addition, if the sequent processes use process temperatures slightly higher than the second reflow temperature of the flowable dielectric layer 106, the capping layer 108 can prevent the flowable dielectric layer 106' from directly affecting the semiconductor materials formed thereon due to the second reflow.

In some other embodiments, the capping layer 108 is a diffusion barrier layer, such as titanium (Ti), titanium nitride (TiN), tantalum nitride (TaN), or a combination thereof, and may be formed by a physical vapor deposition (PVD), sputtering, the like, or a combination thereof. Thus, the capping layer 108 can prevent atoms from the material of the substrate 102 (such as aluminum from an AlN substrate) from diffusing into the overlying semiconductor materials.

In the embodiments of the present disclosure, the substrate structure 100 or 100' has a planar upper surface to form devices including a GaN-based semiconductor material thereon. The semiconductor device including a GaN-based semiconductor material may be a light-emitting diode (LED), a high electron mobility transistor (HEMT), a Schottky bipolar diode (SBD), a bipolar junction transistor (BJT), a junction field effect transistor (JFET), or an insulated gate bipolar transistor (IGBT) or the like. A method for forming a semiconductor device over the substrate structure 100' in FIG. 1E is described below using a HEMT as an example.

Figure 2:
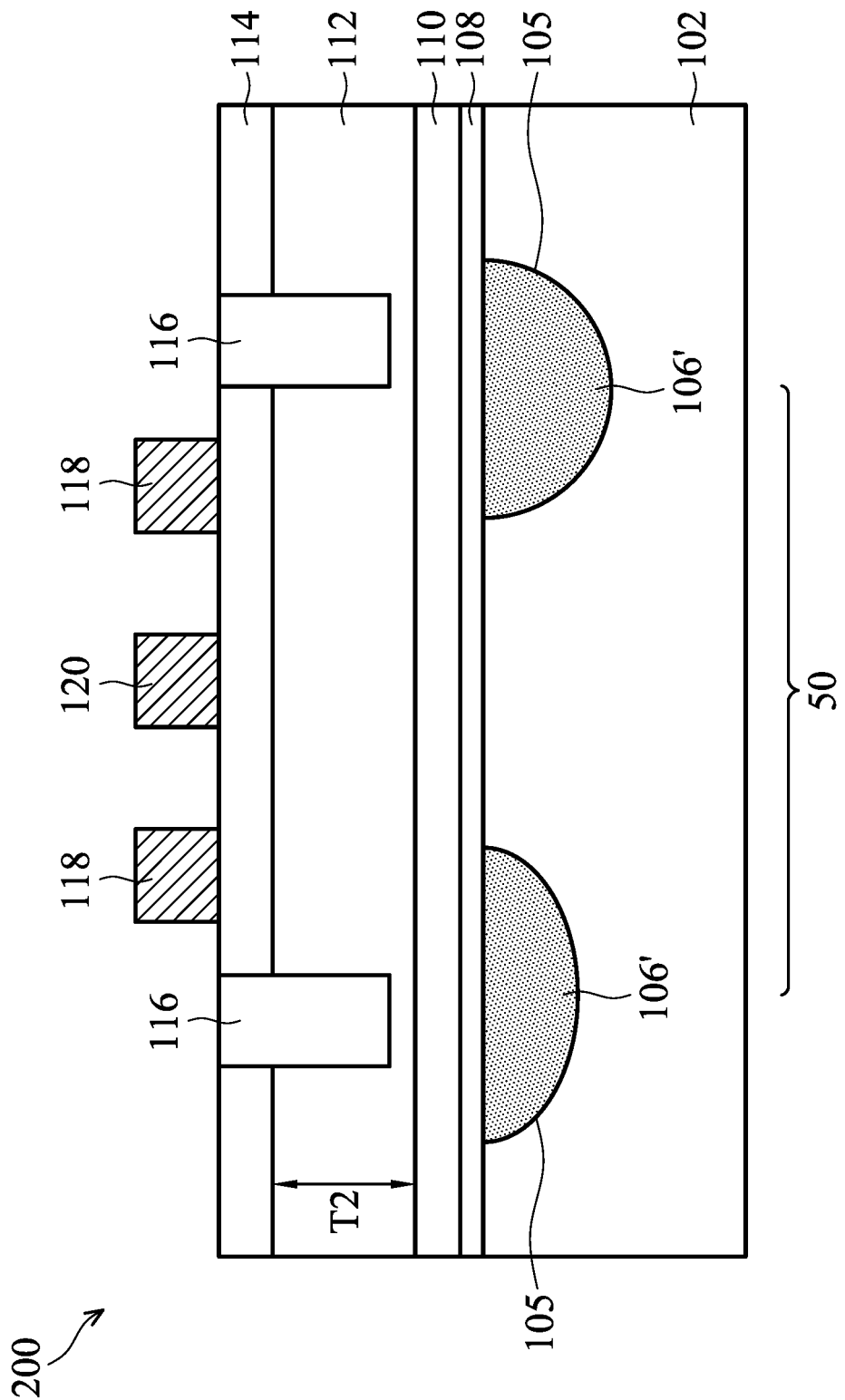
FIG. 2 shows a cross-sectional view of a HEMT formed by using the substrate structure in the FIG. 1E in accordance with some embodiments of the present disclosure.

Referring to FIG. 2, FIG. 2 shows a cross-sectional view of a HEMT 200 formed by using the substrate structure 100' in the FIG. 1E in accordance with some embodiments of the present disclosure.

The breakdown voltage of a HEMT mainly depends on the thickness of the GaN semiconductor layer which serves as a channel layer. For example, when the thickness of the GaN semiconductor layer is increased by 1 μm, the breakdown voltage of a HEMT may be increased by about 100 volts. During an epitaxial growth process for forming a GaN semiconductor layer, it is necessary to use a substrate with high thermal conductivity and high mechanical strength to deposit a GaN semiconductor material thereon, otherwise which may cause the substrate to warp or even crack. Thus, compared to the Si substrate, the AlN substrate has higher thermal conductivity and higher mechanical strength so that the GaN semiconductor layer formed thereon is thicker. For example, the thickness of the GaN semiconductor layer formed on the surface of the Si substrate is from about 2 μm to about 4 μm, while the thickness of the GaN semiconductor layer formed on the surface of the AlN substrate is from about 5 μm to about 15 μm.

Referring to FIG. 2, the substrate structure 100' in the FIG. 1E is provided. FIG. 2 shows a portion of the substrate structure 100' where some pits 104 are present. A HEMT 200 is formed over the portion of the substrate structure 100'. In the embodiment shown in FIG. 2, the substrate 102 is an AlN substrate.

Since temperatures of some processes for fabricating a HEMT may be higher than 500° C., SOG is not suitable for filling the pits 105 in this embodiment. Furthermore, the reflow properties of BPSG are better than those of PSG. In other words, BPSG may be deposited to have a thinner thickness than that of PSG, and then to fully fill the pits in the heat treatment performed at a lower temperature for less time. Thus, in this embodiment, the flowable dielectric material 106 is BPSG having a second reflow temperature that can reach 1100° C.

The material of the capping layer 108 is silicon oxide formed by oxidation of TEOS in a furnace tube. The capping layer 108 covers the upper surface of the substrate 102 and the upper surface of the flowable dielectric material 106' which fills the pit 105.

Next, a buffer layer 110 is formed on the upper surface of the capping layer 108, a GaN semiconductor layer 112 is formed on the buffer layer 110, and an AlGaN semiconductor layer 114 is formed on the GaN semiconductor layer 112. In some embodiments, a seed layer (not shown) may be formed between the capping layer 108 and the buffer layer 110.

The material of the seed layer may be AlN, $Al_2O_3$, AlGaN, SiC, Al or a combination thereof. The seed layer may be a single layer or a multilayered structure. The seed layer may be formed by using an epitaxial growth process, such as metal organic chemical vapor deposition (MOCVD), hydride vapor phase epitaxy (HVPE), molecular beam epitaxy (MBE), a combination thereof or the like.

The buffer layer 110 may be helpful to mitigate a strain of the GaN semiconductor layer 112 which is subsequently formed over the buffer layer 110, and to prevent defects formed in the overlying GaN semiconductor layer 112. The strain is caused by a mismatch between the GaN semiconductor layer 112 and the substrate 102. In some embodiments, the material of the buffer layer 110 may be AlN, GaN, Al$_x$Ga$_{1-x}$N (wherein 0<x<1), a combination thereof, or the like. The buffer layer 110 may be formed by using an epitaxial growth process, such as MOCVD, HVPE, MBE, a combination thereof or the like. Although in the embodiment shown in FIG. 2 the buffer layer 110 is a single layer, the buffer layer 110 may also be a multilayered structure. In addition, in some embodiments, the material used to make the buffer layer 110 is determined by the material of the seed layer and the gas introduced during the epitaxial process.

Two-dimensional electron gas (2DEG, not shown) is formed at a heterogeneous interface between the GaN semiconductor layer 112 and the AlGaN semiconductor layer 114. In some embodiments, the GaN semiconductor layer 112 and the AlGaN semiconductor layer 114 may have no dopant therein. In some other embodiments, the GaN semiconductor layer 112 and the AlGaN semiconductor layer 114 may be doped, such as with an n-type or a p-type dopant. The GaN semiconductor layer 112 and the AlGaN semiconductor layer 114 may be formed by using epitaxial growth processes, such as MOCVD, HVPE, MBE, a combination thereof or the like.

In the embodiment shown in FIG. 2, since the substrate 102 is the AlN substrate with high thermal conductivity and high mechanical strength, the GaN semiconductor layer 112 may be deposited to have a thickness T2 which is from 5 μm to about 15 μm.

Next, an isolation structure 116 is formed in the GaN semiconductor layer 112 and the AlGaN semiconductor layer 114 to define an active region 50. The material used in the isolation structure 116 may be a dielectric material, such as silicon oxide, silicon nitride, silicon oxynitride, the like, or a combination thereof. The isolation structure 116 may be formed by an etching process and a deposition process.

Next, source/drain electrodes 118 and a gate electrode 120 between the source/drain electrodes 118 are formed on the AlGaN semiconductor layer 114 in the active region 50 to form a HEMT 200. In some embodiments, the material of the source/drain electrodes 118 and the gate electrode 120 may be metal materials or semiconductor materials. The metal material may be gold (Au), nickel (Ni), platinum (Pt), palladium (Pd), iridium (Ir), titanium (Ti), chromium (Cr), tungsten (W), aluminum (Al), copper (Cu), the like, a combination thereof, or multilayers thereof. The semiconductor material may be polycrystalline silicon or polycrystalline germanium. The steps of forming the source/drain electrodes 118 and the gate electrode 120 may include forming a conductive material on the AlGaN semiconductor layer 114, and then patterning the conductive material to form the source/drain electrodes 118 and the gate electrode 120. The source/drain electrodes 118 and the gate electrode 120 may be formed in the same process or may be formed separately in different processes.

As shown in FIG. 2, since the flowable dielectric material 106' fully fills the pits 105 at the upper surface of the substrate 102, the material layers formed over the substrate 102 may not be formed in the pits 105. Thus, the manufacturing yield of the HEMT 200 is improved.

In summary, the embodiments of the present disclosure provide a method for fabricating a semiconductor structure. The method includes forming a flowable dielectric material on a substrate having pits exposed from the upper surface of the substrate, reflowing and filling the flowable dielectric material into the pits by a heat treatment, and then performing a planarization process on the flowable dielectric material to expose the upper surface of the substrate, so that the substrate can provide a planar surface for subsequent semiconductor processes.

In addition, in the embodiments of the present disclosure, the flowable dielectric material reflows into the pits by the heat treatment to fully fill the pits, so that the thickness of the flowable dialectic material can have the thickness lower than the size of the pit. Thus, the deposit thickness of the dielectric material and the process time of filling the pits can be significantly reduced, which reduces manufacturing cost.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate having a pit exposed from an upper surface of the substrate;
   a flowable dielectric material which fully fills the pit;
   a GaN-based semiconductor layer disposed over the substrate and the flowable dielectric material, and
   a capping layer disposed between the substrate and the GaN-based semiconductor layer and covering the flowable dielectric material.

2. The semiconductor structure as claimed in claim 1, wherein the flowable dielectric material does not cover the upper surface of the substrate.

3. The semiconductor structure as claimed in claim 1, wherein a material of the capping layer is an insulating material.

4. The semiconductor structure as claimed in claim 1, wherein the substrate is an AlN substrate, a SiC substrate or a sapphire substrate.

5. The semiconductor structure as claimed in claim 1, wherein the flowable dielectric material is spin-on glass (SOG), borophosphosilicate glass (BPSG), or phosphosilicate glass (PSG).

6. The semiconductor structure as claimed in claim 1, further comprising:
   a semiconductor device disposed over the substrate, wherein the semiconductor device includes the GaN-based semiconductor layer,
   wherein the semiconductor device is a light-emitting diode (LED), a high electron mobility transistor (HEMT), a Schottky bipolar diode (SBD), a bipolar junction transistor (BJT), a junction field effect transistor (JFET), or an insulated gate bipolar transistor (IGBT).

7. A high electron mobility transistor (HEMT), comprising:
   an AlN substrate having pits exposed from an upper surface of the AlN substrate;
   a borophosphosilicate glass (BPSG) which fully fills the pits;
   a GaN semiconductor layer disposed over the AlN substrate and the BPSG, wherein the GaN semiconductor layer has a thickness that is from 5 μm to 15 μm;
   an AlGaN semiconductor layer disposed over the GaN semiconductor layer; and
   a source electrode, a drain electrode and a gate electrode disposed over the AlGaN semiconductor layer.

8. A method for fabricating a semiconductor structure, comprising:
   providing a substrate having a pit exposed from an upper surface of the substrate;
   forming a flowable dielectric material on the substrate;
   performing a heat treatment so that the flowable dielectric material reflows into and fully fills the pit;
   performing a planarization process to remove a portion of the flowable dielectric material outside of the pit and expose the upper surface of the substrate; and
   forming a GaN-based semiconductor layer over the substrate after the planarization process.

9. The method as claimed in claim 8, wherein the flowable dielectric material partially fills the pit prior to the heat treatment.

10. The method as claimed in claim 8, wherein the substrate is an AlN substrate, a SiC substrate or a sapphire substrate.

11. The method as claimed in claim 8, wherein the flowable dielectric material is borophosphosilicate glass (BPSG).

12. The method as claimed in claim 11, wherein forming the flowable dielectric material comprises depositing the flowable dielectric material to have a thickness that is from 0.3 to 0.6 of a size of the pit.

13. The method as claimed in claim 11, wherein the heat treatment is performed at a temperature of from 800° C. to 1000° C.

14. The method as claimed in claim 8, wherein the flowable dielectric material is spin-on glass (SOG).

15. The method as claimed in claim 14, wherein forming the flowable dielectric material comprises depositing the flowable dielectric material to have a thickness from 0.15 to 0.3 of a size of the pit.

16. The method as claimed in claim 14, wherein a temperature of the heat treatment is from 300° C. to 500° C.

17. The method as claimed in claim 8, further comprising:
   forming a capping layer on the substrate to cover a remaining portion of the flowable dielectric material in the pit after the planarization process and prior to forming the GaN-based semiconductor layer.

* * * * *